(12) United States Patent
Noguchi et al.

(10) Patent No.: US 11,503,715 B2
(45) Date of Patent: Nov. 15, 2022

(54) OPTICAL MODULE

(71) Applicant: CIG Photonics Japan Limited, Kanagawa (JP)

(72) Inventors: Daisuke Noguchi, Tachikawa (JP); Hiroshi Yamamoto, Inagi (JP)

(73) Assignee: CIG PHOTONICS JAPAN LIMITED, Sagamihara (JP)

( * ) Notice: Subject to any disclaimer, the term of this patent is extended or adjusted under 35 U.S.C. 154(b) by 0 days.

(21) Appl. No.: 17/506,861

(22) Filed: Oct. 21, 2021

(65) Prior Publication Data

US 2022/0201863 A1 Jun. 23, 2022

(30) Foreign Application Priority Data

Dec. 23, 2020 (JP) .............................. JP2020-213344

(51) Int. Cl.
*H01S 5/026* (2006.01)
*H05K 1/18* (2006.01)
*H05K 1/11* (2006.01)

(52) U.S. Cl.
CPC ............. *H05K 1/181* (2013.01); *H01S 5/026* (2013.01); *H05K 1/113* (2013.01); *H05K 2201/105* (2013.01); *H05K 2201/10015* (2013.01); *H05K 2201/10121* (2013.01); *H05K 2201/10287* (2013.01); *H05K 2201/10545* (2013.01)

(58) Field of Classification Search
CPC ....................................................... H01S 5/026
USPC ......................................................... 361/777
See application file for complete search history.

(56) References Cited

U.S. PATENT DOCUMENTS

| 2020/0041735 | A1* | 2/2020 | Noguchi | .............. G02B 6/4256 |
| 2020/0192038 | A1* | 6/2020 | Noguchi | .............. G02B 6/4248 |
| 2021/0033806 | A1* | 2/2021 | Noguchi | .............. G02B 6/4206 |
| 2021/0076500 | A1* | 3/2021 | Noguchi | ................. H05K 1/14 |
| 2021/0132305 | A1* | 5/2021 | Noguchi | .............. G02B 6/428 |
| 2021/0184056 | A1* | 6/2021 | Noguchi | .............. H01L 31/024 |
| 2021/0195746 | A1* | 6/2021 | Noguchi | .............. H05K 1/113 |
| 2021/0271038 | A1* | 9/2021 | Noguchi | .............. G02B 6/4274 |
| 2021/0336701 | A1* | 10/2021 | Noguchi | ................. H05K 1/181 |
| 2021/0351563 | A1* | 11/2021 | Noguchi | .............. H01S 5/02212 |
| 2022/0061159 | A1* | 2/2022 | Noguchi | .............. H05K 3/363 |
| 2022/0103262 | A1* | 3/2022 | Noguchi | ................. H01L 24/05 |
| 2022/0224073 | A1* | 7/2022 | Wang | ................. H01S 5/02253 |
| 2022/0278500 | A1* | 9/2022 | Noguchi | ............. H01S 5/02415 |

FOREIGN PATENT DOCUMENTS

JP 2019-040949 A 3/2019
JP 2020-127168 A 8/2020

* cited by examiner

*Primary Examiner* — Stanley Tso
(74) *Attorney, Agent, or Firm* — Mattingly & Malur, PC

(57) ABSTRACT

The first capacitor is opposed to and electrically connected to the first back electrode. The second capacitor is opposed to and electrically connected to the second back electrode. Each of the first circuit and the second circuit has a main region that overlaps with a corresponding one of the first capacitor and the second capacitor. At least one circuit of the first circuit and the second circuit has an extension region extending from the main region toward another circuit of the first circuit and the second circuit. At least one of one of the pair of first wires and the second wire is bonded to the extension region.

11 Claims, 9 Drawing Sheets

OPTICAL MODULE

CROSS-REFERENCE TO RELATED APPLICATION

The present application claims priority from Japanese patent application JP2020-213344 filed on Dec. 23, 2020, the contents of which are hereby incorporated by reference into this application.

BACKGROUND

1. Field

This disclosure relates to an optical module.

2. Description of the Related Art

There is a known semiconductor optical device in which a semiconductor laser, an optical modulator, and an amplifier are monolithically integrated (JP2019-40949A). A bypass capacitor may be connected in parallel to each of the semiconductor laser and the amplifier, whereby high-frequency signals superimposed on DC signals can be separated. A termination resistor is connected in parallel to the optical modulator to prevent unnecessary signal reflection. A decoupling capacitor may be connected in series to the termination resistor so that no DC component is applied, thereby enabling lower power consumption.

Fewer wires for electrical connection are preferable as long as a reduction of high-frequency characteristics due to inductance is not serious. Additionally, some wires are inevitably in contact with each other depending on their bonding positions, requiring countermeasures against short circuiting.

SUMMARY

This disclosure aims at avoiding problems on wire bonding.

(1) An optical module includes: a semiconductor optical device with a pair of first pads spaced apart in a first direction and with a second pad between the pair of first pads; a sub-board with a first circuit and a second circuit adjacent in the first direction on a surface thereof, the sub-board having a first back electrode on a back surface thereof to be electrically continuous to and overlap with the first circuit, the sub-board having a second back electrode on the back surface to be electrically continuous to and overlap with the second circuit, the sub-board being next to the semiconductor optical device in a second direction intersecting with the first direction; a pair of first wires electrically connecting the respective pair of first pads to the first circuit; a second wire electrically connecting the second pad to the second circuit; and a first capacitor and a second capacitor, over which the sub-board is placed, the first capacitor and the second capacitor being adjacent to each other in the first direction, the first capacitor being opposed to and electrically connected to the first back electrode, the second capacitor being opposed to and electrically connected to the second back electrode, each of the first circuit and the second circuit having a main region that overlaps with a corresponding one of the first capacitor and the second capacitor, at least one circuit of the first circuit and the second circuit having an extension region extending from the main region toward another circuit of the first circuit and the second circuit, at least one of one of the pair of first wires and the second wire being bonded to the extension region.

The first circuit and the second circuit are electrically connected to the first capacitor and the second capacitor with the first back electrode and the second back electrode, respectively. This enables use of fewer wires. Besides, the extension region extends from the first circuit to the second circuit, or vice versa. This can avoid contact between the pair of first wires and the second wire.

(2) In the optical module according to (1), the pair of first wires may be bonded to the first circuit at a pair of positions separated from each other in the first direction.

(3) In the optical module according to (2), the second wire may be bonded to the second circuit at a position between the pair of positions in the first direction.

(4) In the optical module according to any one of (1) to (3), the first circuit may have the extension region, and the one of the pair of first wires may be bonded to the extension region of the first circuit.

(5) In the optical module according to (4), the extension region of the first circuit may be farther from the semiconductor optical device than a position where the second wire is bonded to the second circuit.

(6) In the optical module according to (5), the extension region of the first circuit may be farther from the first capacitor than the position where the second wire is bonded to the second circuit.

(7) In the optical module according to (5) or (6), the extension region of the first circuit may overlap with the second capacitor.

(8) In the optical module according to any one of (5) to (7), each of the first circuit and the second circuit may have the extension region, and the one of the pair of first wires may be bonded to the extension region at a position farther from the first capacitor than the position where the second wire is bonded to the extension region.

(9) In the optical module according to (8), the extension region of the first circuit and the extension region of the second circuit may be adjacent to each other in the second direction.

(10) In the optical module according to (9), the extension region of the second circuit may be closer to the semiconductor optical device than the extension region of the first circuit.

(11) In the optical module according to any one of (1) to (10), at least one of the first circuit and the second circuit may include an interconnect line and a pad and a resistor connected in series between the interconnect line and the pad, and at least part of the pad may be the extension region.

DETAILED DESCRIPTION

Figure 1:
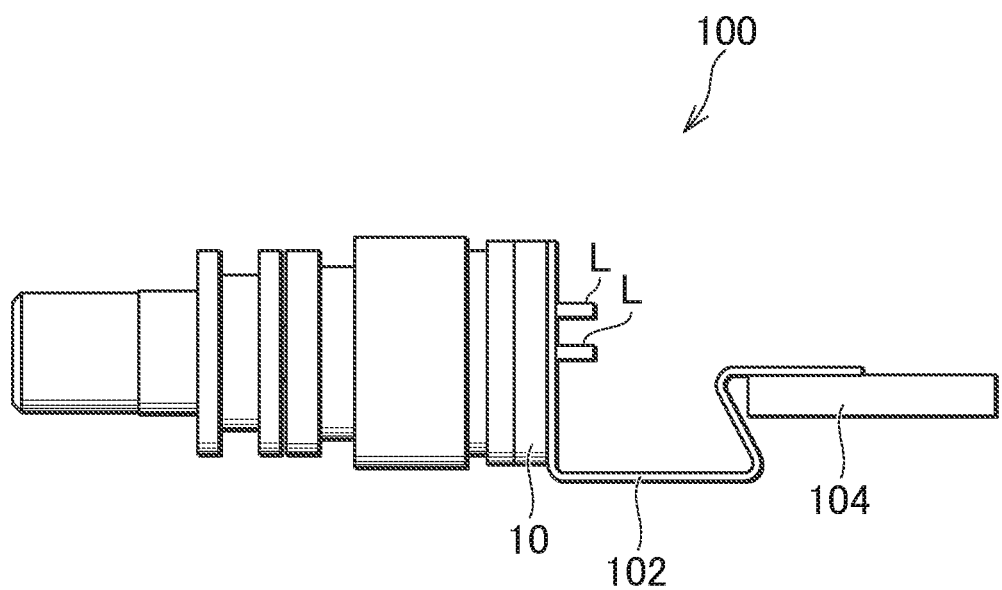
FIG. 1 is a perspective view of an optical module according to a first embodiment.

Hereinafter, some embodiments will be described specifically and in detail with reference to drawings. In all the drawings, the members with the same reference numerals have the identical or same feature and their repetitive description will be omitted. Sizes of figures do not always comply with magnification.

First Embodiment

FIG. 1 is a perspective view of an optical module according to a first embodiment. The optical module 100 is a transistor outline can (TO-CAN) type optical module, and may be any of a transmitter optical sub-assembly (TOSA) with a light emitting device, a receiver optical sub-assembly (ROSA) with a light receiving device, and a bidirectional optical sub-assembly (BOSA) with both a light emitting device and a light receiving device. The optical module 100 has a flexible printed circuit board (FPC) 102 adapted to be connected to a printed circuit board (PCB) 104. The optical module 100 has a stem 10.

Figure 2:
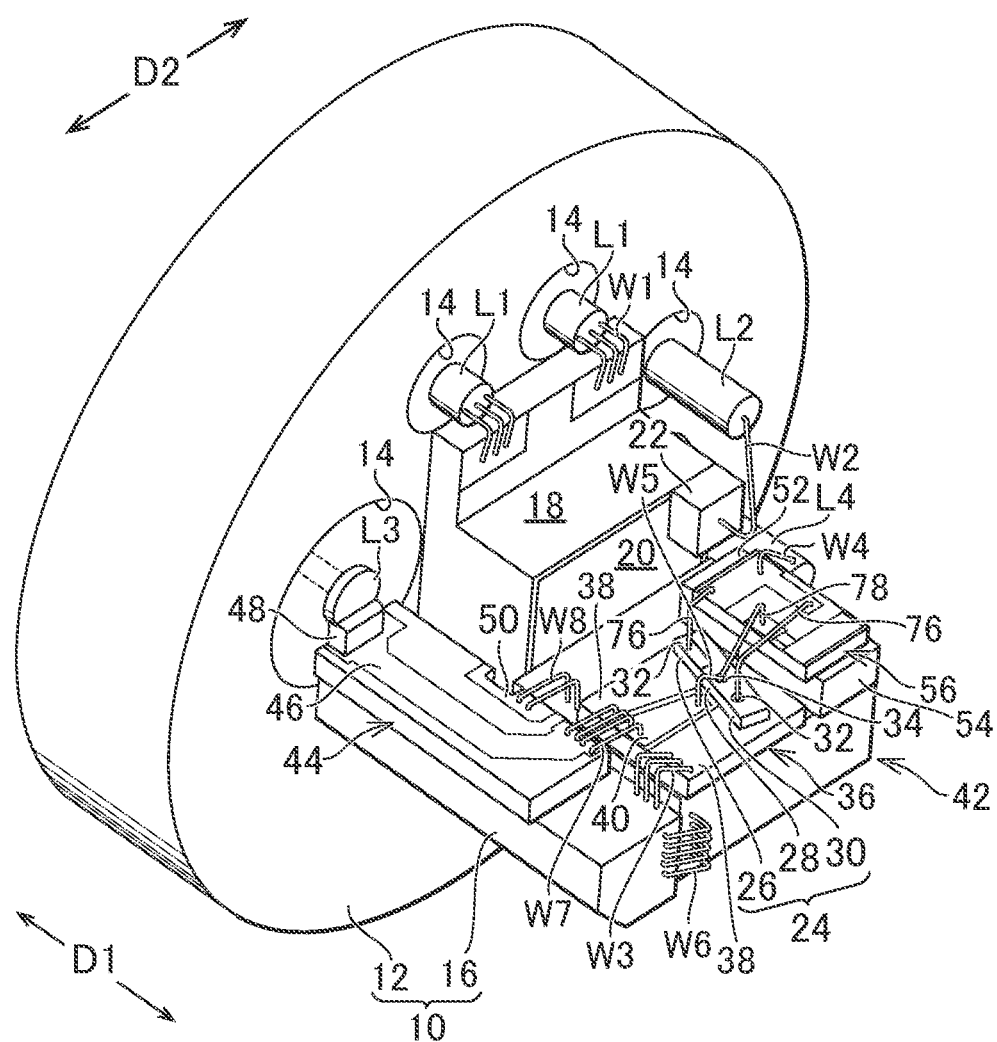
FIG. 2 is a perspective view of a stem and an electronic component mounted on it.
Figure 3:
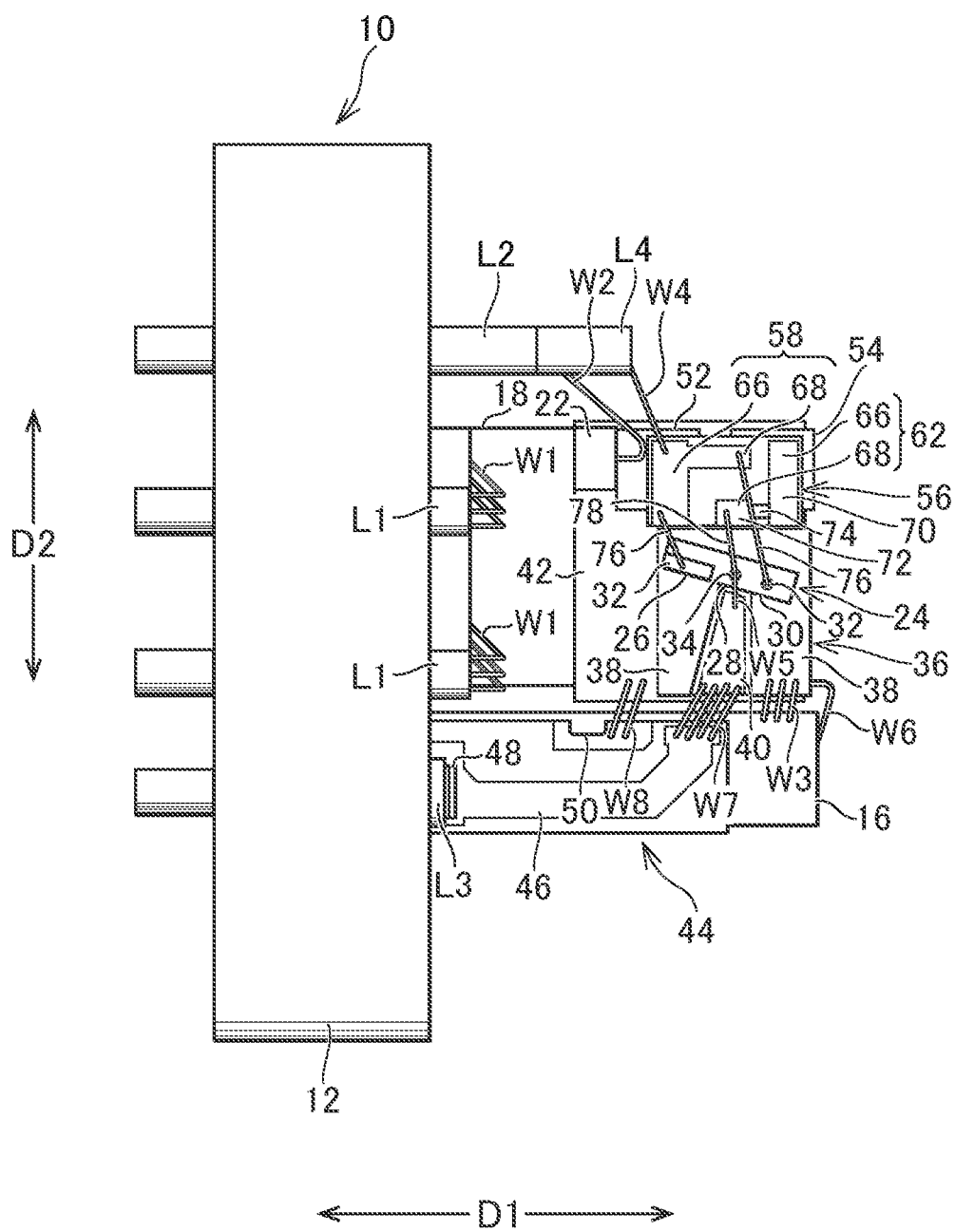
FIG. 3 is a plan view of the stem and the electronic component mounted on it.

FIG. 2 is a perspective view of a stem 10 and an electronic component mounted on it. FIG. 3 is a plan view of the stem 10 and the electronic component mounted on it. The stem 10 is made of a conductive material such as a metal. The stem 10 includes an eyelet 12. The eyelet 12 has some through holes 14 penetrating between its front and back surfaces in a thickness direction. The stem 10 has a pedestal portion 16 integral with the eyelet 12. The pedestal portion 16 protrudes from a surface of the eyelet 12. The pedestal portion 16 is also made of a conductor. The stem 10 is connected to a reference potential (e.g., ground).

The optical module 100 has some lead pins L. The lead pins L are fixed inside the through holes 14 but are insulated from the stem 10 with an insulator such as glass. The lead pins L are connected to the flexible printed circuit board 102 (FIG. 1).

The optical module 100 has a thermoelectric cooler 18. The thermoelectric cooler 18 has an upper surface and a lower surface. The upper surface and the lower surface are made of an insulator such as ceramic. The lower surface is fixed to the stem 10 (i.e., eyelet 12). A thermally conductive adhesive may be used for fixing. The thermoelectric cooler 18 contains a Peltier device (not shown) configured to transfer heat between the upper surface and the lower surface. For example, the upper surface may serve as a heat absorbing surface and the lower surface may serve as a heat radiating surface, or vice versa by switching. The thermoelectric cooler 18 has an electrode connected to the lead pin L1 with a wire W1.

A metal layer 20 is laminated on the upper surface of the thermoelectric cooler 18. The metal layer 20 serves as a reference potential plane (e.g., ground plane). A thermistor 22 is on and electrically connected to the metal layer 20, whereby temperature can be measured. The thermistor 22 is connected to a lead pin L2 with a wire W2 to apply a voltage.

[Semiconductor Optical Device]

The optical module 100 has a semiconductor optical device 24. The semiconductor optical device 24 is configured to convert an electrical signal and an optical signal at least from one to another. The semiconductor optical device 24 has a semiconductor laser 26 monolithically integrated therein as a light source. The semiconductor optical device 24 has an optical modulator 28 (e.g., electro-absorption modulator) monolithically integrated therein to apply modulation to output light from the semiconductor laser 26. Furthermore, the semiconductor optical device 24 has an optical amplifier 30 (e.g., semiconductor optical amplifier) monolithically integrated therein to improve laser output. The semiconductor optical device 24 has a rectangular parallelepiped shape.

The semiconductor optical device 24 has a pair of first pads 32 arranged in a longitudinal direction. The pair of first pads 32 are spaced apart from each other in a first direction D1. The pair of first pads 32 are electrically connected to the semiconductor laser 26 and the optical amplifier 30, respectively, to input a DC signal (DC voltage). The semiconductor optical device 24 has a second pad 34 between the pair of first pads 32. The pair of first pads 32 and the second pad 34 are arranged in the longitudinal direction of the semiconductor optical device 24. The second pad 34 is electrically connected to the optical modulator 28 to input high-frequency signals.

[Mounting Substrate]

The semiconductor optical device 24 is mounted on a mounting substrate 36. The mounting substrate 36 has a mounting surface on which the semiconductor optical device 24 is mounted. The semiconductor optical device 24 is disposed to have its optical axis arranged to extend in a direction parallel to the mounting surface. Incidentally, the semiconductor optical device 24 is disposed obliquely with respect to the first direction D1 to emit light obliquely from its end face. The upper surface of the thermoelectric cooler 18 and the mounting surface face in a direction intersecting with (e.g., perpendicular to) each other. The mounting substrate 36 on the mounting surface has a first ground pattern 38 and a first signal pattern 40.

The semiconductor optical device 24 has its back surface (cathode electrode) bonded to the first ground pattern 38. The first ground pattern 38 is, with an unillustrated side electrode or an unillustrated through holes, capable of electrical connection on a side opposite to the mounting surface. The first ground pattern 38 is connected to the pedestal portion 16 with a wire W3. The first signal pattern 40 is electrically connected to the second pad 34 of the semiconductor optical device 24 (optical modulator 28) with a wire W5 to input high-frequency signals.

The mounting substrate 36 is mounted on a support block 42. The support block 42 is made of a conductive material (e.g., metal). The support block 42 is electrically connected to the pedestal portion 16 with a wire W6. A relay board 44 is mounted on the pedestal portion 16. The relay board 44 has a second signal pattern 46. The second signal pattern 46 is electrically connected to the lead pin L3. Specifically, there is a filler metal 48 (solder, brazing material) between an end of the lead pin L3 and a terminal of the second signal pattern 46, whereby both of them are electrically connected.

The second signal pattern 46 is connected to the first signal pattern 40 with a wire W7. The relay board 44 has a second ground pattern 50. The second ground pattern 50 is integrated with a side electrode to enable electrical connection on a rear surface, and is electrically connected to the pedestal portion 16. The second ground pattern 50 is connected to the support block 42 with a wire W8.

[First Capacitor]

The optical module 100 has a first capacitor 52 (bypass capacitor). The first capacitor 52 is connected in parallel to each of the semiconductor laser 26 and the optical amplifier 30 (a pair of first pads 32) to separate high-frequency signals superimposed on DC signals. The first capacitor 52 is mounted on the support block 42.

[Second Capacitor]

The optical module 100 has a second capacitor 54 (decoupling capacitor). The second capacitor 54 is configured not to pass a DC component through a termination resistor that prevents unnecessary reflection of signals, thereby reducing power consumption. The second capacitor 54 is next to the first capacitor 52 in the first direction D1. To prevent short-circuiting, the first capacitor 52 and the second capacitor 54 have the same thickness in design, and are mounted to be 150 μm or more spaced apart. The second capacitor 54 is mounted on the support block 42.

[Sub-Board]

A sub-board 56 is placed over the first capacitor 52 and the second capacitor 54. A conductive adhesive may be used for fixing them. This leads to space-saving mounting and enables an increase in capacitance of the first capacitor 52 and the second capacitor 54, whereby improvement in characteristics can be expected. The sub-board 56 is next to the semiconductor optical device 24 in a second direction D2 intersecting with (e.g., perpendicular to) the first direction D1.

Figure 4:
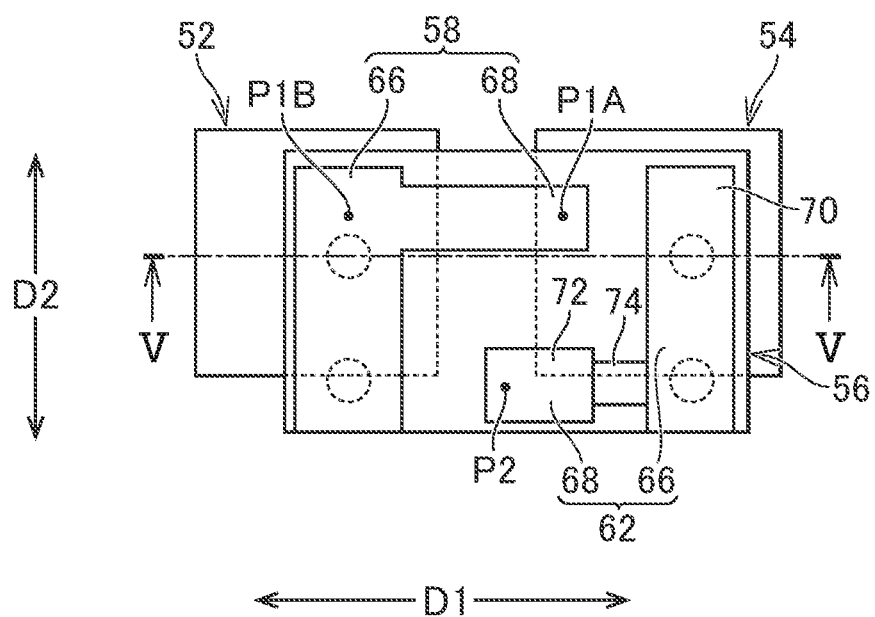
FIG. 4 is a plan view of a first capacitor and a second capacitor and a sub-board.
Figure 5:
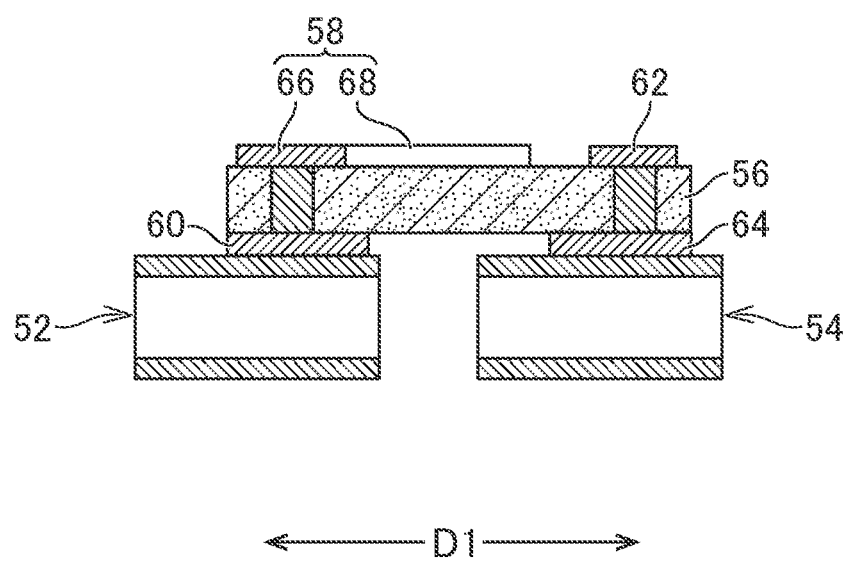
FIG. 5 is a V-V cross-sectional view of a structure shown in FIG. 4.

FIG. 4 is a plan view of a first capacitor 52 and a second capacitor 54 and a sub-board 56. FIG. 5 is a V-V cross-sectional view of a structure shown in FIG. 4.

The sub-board 56 has a first circuit 58 on its top surface. The sub-board 56 on its back surface has a first back electrode 60 that overlaps with and is electrically continuous to the first circuit 58. A side electrode or a via can be used for electrical continuity between the first circuit 58 and the first back electrode 60. The first capacitor 52 (upper electrode) is opposed to and electrically connected to the first back electrode 60. The first capacitor 52 has a lower electrode electrically continuous to the support block 42, and is connected to the reference potential (e.g., ground). No wire is used, therefore enabling a reduction in parasitic inductance.

The sub-board 56 has a second circuit 62 on its top surface. The first circuit 58 and the second circuit 62 are adjacent in the first direction D1. The sub-board 56 on its back surface has a second back electrode 64 that overlaps with and is electrically continuous to the second circuit 62. A side electrode or a via can be used for electrical continuity between the second circuit 62 and the second back electrode 64. The second capacitor 54 (upper electrode) is opposed to and electrically connected to the second back electrode 64. The second capacitor 54 has a lower electrode electrically continuous to the support block 42, and is connected to the reference potential (e.g., ground). No wire is used, therefore enabling a reduction in parasitic inductance.

The first circuit 58 and the second circuit 62 are electrically connected to the first capacitor 52 and the second capacitor 54, respectively, with the first back electrode 60 and the second back electrode 64. As a result, fewer wires may be used.

The first circuit 58 has a main region 66 overlapping with the first capacitor 52. The main region 66 of the first circuit 58 is connected to the lead pin L4 with a wire W4 (FIGS. 2 and 3). The first circuit 58 has an extension region 68 extending from the main region 66 toward the second circuit 62. The extension region 68 of the first circuit 58 overlaps with the second capacitor 54.

The second circuit 62 has a main region 66 overlapping with the second capacitor 54. The second circuit 62 has an extension region 68 extending from the main region 66 toward the first circuit 58. The extension region 68 of the first circuit 58 and the extension region 68 of the second circuit 62 are adjacent in the second direction D2. The extension region 68 of the second circuit 62 is closer to the semiconductor optical device 24 than the extension region 68 of the first circuit 58.

The second circuit 62 includes an interconnect line 70 and a pad 72, and a resistor 74 (termination resistor) connected in series between the interconnect line 70 and the pad 72. At least part of the pad 72 is the extension region 68. The resistor 74 is configured to consume energy of the high frequency signals to prevent unwanted signal reflection. The second capacitor 54 is connected in series to the resistor 74, thereby preventing flow of the DC component. This enables low power consumption.

[First Wire]

As shown in FIG. 3, the optical module 100 has a pair of first wires 76. The pair of first wires 76 electrically connect the respective pair of first pads 32 to the first circuit 58. A pair of positions P1A, P1B (FIG. 4) where the pair of first wires 76 are bonded to the first circuit 58 are spaced apart in the first direction D1. One of the pair of first wires 76 is bonded to the extension region 68 of the first circuit 58.

[Second Wire]

As shown in FIG. 3, the optical module 100 has a second wire 78 that electrically connects the second pad 34 to the second circuit 62. The second wire 78 is bonded to the second circuit 62 between the pair of positions P1A, P1B (FIG. 4) arranged in the first direction D1. The second wire 78 is bonded to the extension region 68.

The position P1A (FIG. 4) where one of the pair of first wires 76 is bonded to the extension region 68 is farther from the first capacitor 52 than the position P2 (FIG. 4) where the second wire 78 is bonded to the extension region 68. The extension region 68 of the first circuit 58 is farther from the semiconductor optical device 24 than the position P2 where the second wire 78 is bonded to the second circuit 62. A tip of the extension region 68 of the first circuit 58 is farther from the first capacitor 52 than the position P2 where the second wire 78 is bonded to the second circuit 62.

The extension region 68 extends from the first circuit 58 to the second circuit 62 (or vice versa). This can avoid contact between the pair of first wires 76 and the second wire 78.

[Equivalent Circuit]

Figure 6:
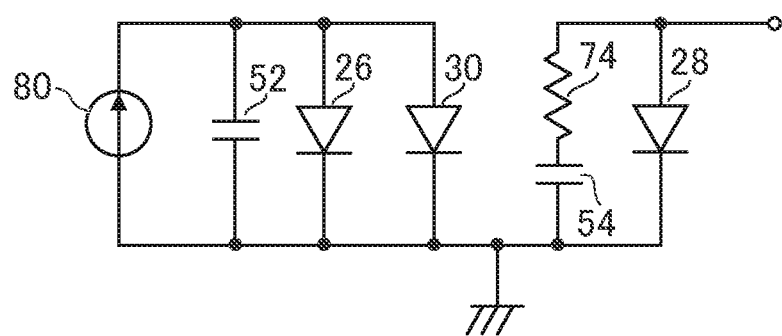
FIG. 6 is an equivalent circuit diagram of the optical module.

FIG. 6 is an equivalent circuit diagram of the optical module 100. DC signals are input from a current source 80 to each of the semiconductor laser 26 and the optical amplifier 30. High-frequency signals are input to the optical modulator 28. The semiconductor laser 26, the optical modulator 28, and the optical amplifier 30 share an unillustrated cathode electrode. Therefore, the semiconductor laser 26 and the optical amplifier 30 are affected by the high-frequency signals. So, the first capacitor 52 is connected in parallel to each of the semiconductor laser 26 and the optical amplifier 30, thereby separating the high-frequency signals superimposed on the DC signals.

The resistor 74 is connected in parallel to the optical modulator 28. This can prevent unnecessary signal reflection by consuming energy of the high-frequency signals. Further, the second capacitor 54 is connected in series to the resistor 74, therefore preventing flow of a DC component. This enables low power consumption.

[Simulation]

Figure 7:
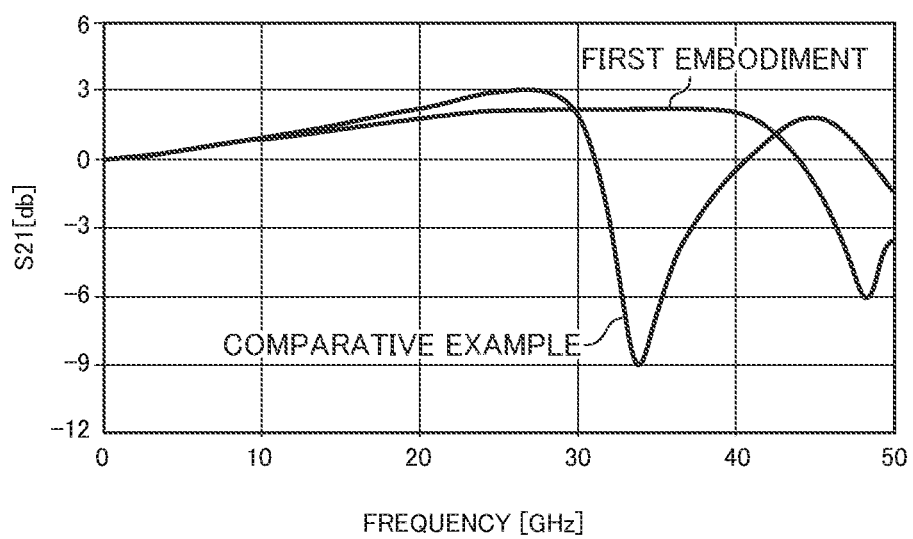
FIG. 7 is a diagram of frequency characteristics, in a comparative example and the first embodiment, obtained by simulation using a three-dimensional electric field analysis tool.

FIG. 7 is a diagram of frequency characteristics, in a comparative example and the first embodiment, obtained by simulation using a three-dimensional electric field analysis tool. In the comparative example, a decoupling capacitor and a termination resistor were connected with a wire. In the first embodiment, there is no wire between the second capacitor 54 (decoupling capacitor) and the resistor 74 (termination resistor), reducing the inductance, greatly improving the characteristics.

Second Embodiment

Figure 8:
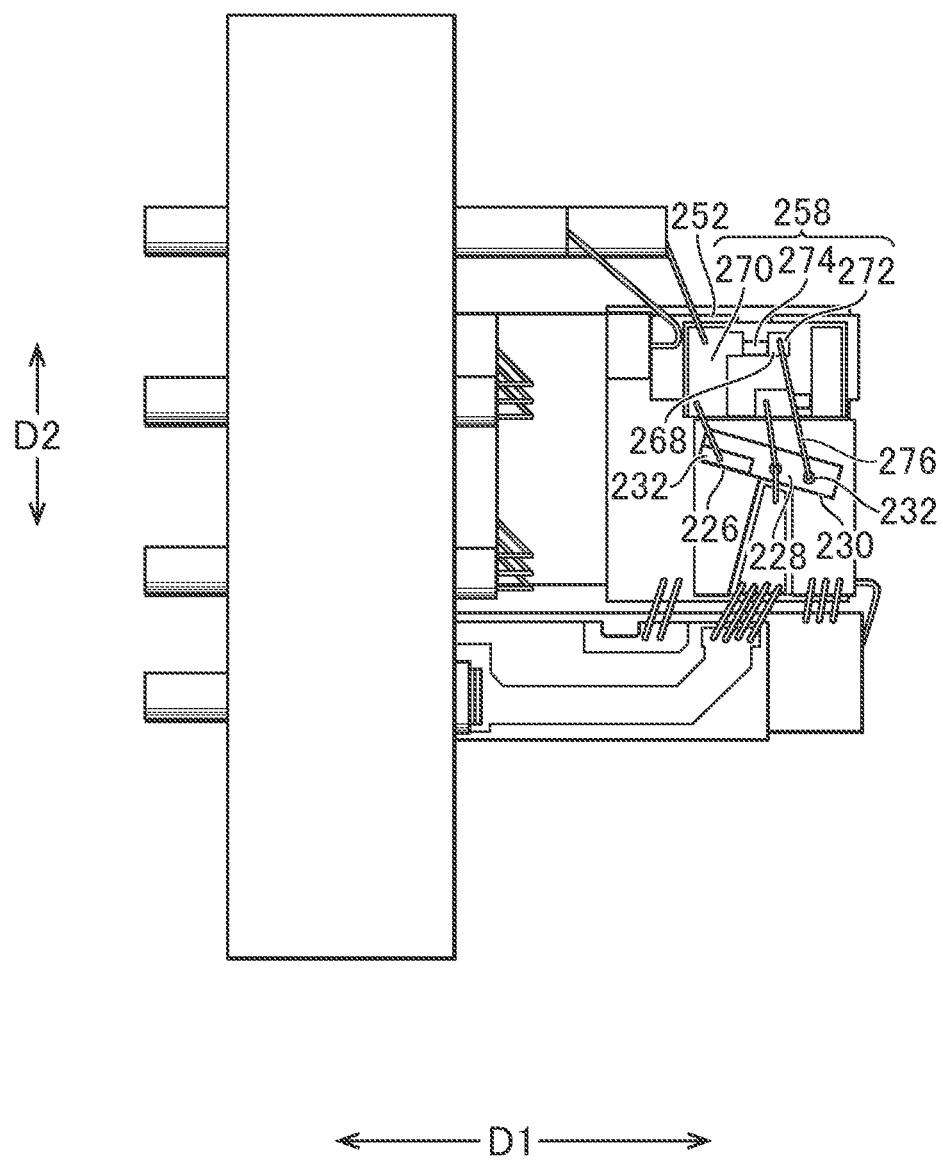
FIG. 8 is a plan view of a stem and an electronic component mounted on it according to a second embodiment.

FIG. 8 is a plan view of a stem and an electronic component mounted on it according to a second embodiment. The first circuit 258 includes the interconnect line 270 and the pad 272 and the resistor 274 (damping resistor) connected in series between the interconnect line 270 and the pad 272. At least part of the pad 272 is the extension region 268. The first wire 276, which is bonded to the extension region 268, is bonded to the first pad 232 of the optical amplifier 230. Therefore, the resistor 274 and the first capacitor 252 are connected in parallel to the optical amplifier 230. This can increase an amount of a shunting current flowing to the semiconductor laser 226. Further, the optical amplifier 230 is vulnerable to superimposition of high-frequency signals due to being close to the optical modulator 228, but noises can be reduced by the resistor 274. For other details, the contents described in the first embodiment is applicable.

Figure 9:
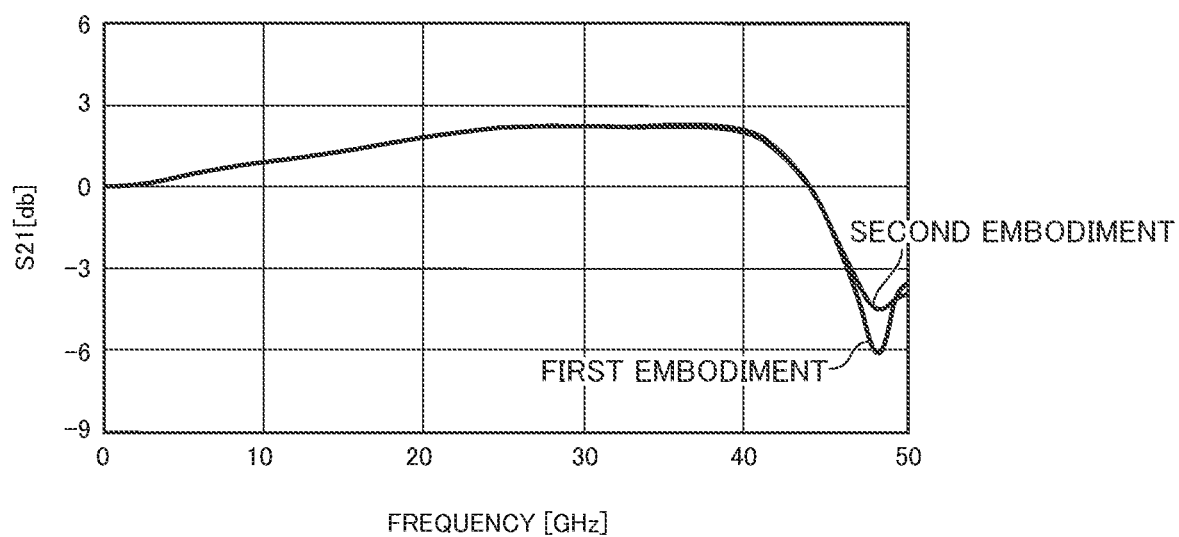
FIG. 9 is a diagram of frequency characteristics, in the first embodiment and the second embodiment, obtained by simulation using the three-dimensional electric field analysis tool.

FIG. 9 is a diagram of frequency characteristics, in the first embodiment and the second embodiment, obtained by simulation using the three-dimensional electric field analysis tool. In the second embodiment, the resistor 274 (damping resistor) can reduce the high-frequency signals superimposed on the first circuit 258. This effect can improve a loss around 48 GHz. Further improvement of the loss may be possible by further raising the resistance value, but an optimum resistance value depends on conditions of use, due to a trade-off with power consumption.

The embodiments described above are not limited and different variations are possible. The structures explained in the embodiments may be replaced with substantially the same structures and other structures that can achieve the same effect or the same objective.

What is claimed is:

1. An optical module comprising:
   a semiconductor optical device with a pair of first pads spaced apart in a first direction and with a second pad between the pair of first pads;
   a sub-board with a first circuit and a second circuit adjacent in the first direction on a surface thereof, the sub-board having a first back electrode on a back surface thereof to be electrically continuous to and overlap with the first circuit, the sub-board having a second back electrode on the back surface to be electrically continuous to and overlap with the second circuit, the sub-board being next to the semiconductor optical device in a second direction intersecting with the first direction;
   a pair of first wires electrically connecting the respective pair of first pads to the first circuit;
   a second wire electrically connecting the second pad to the second circuit; and
   a first capacitor and a second capacitor, over which the sub-board is placed, the first capacitor and the second capacitor being adjacent to each other in the first direction,
   the first capacitor being opposed to and electrically connected to the first back electrode,
   the second capacitor being opposed to and electrically connected to the second back electrode,
   each of the first circuit and the second circuit having a main region that overlaps with a corresponding one of the first capacitor and the second capacitor,
   at least one circuit of the first circuit and the second circuit having an extension region extending from the main region toward another circuit of the first circuit and the second circuit,
   at least one of one of the pair of first wires and the second wire being bonded to the extension region.

2. The optical module according to claim 1, wherein the pair of first wires are bonded to the first circuit at a pair of positions separated from each other in the first direction.

3. The optical module according to claim 2, wherein the second wire is bonded to the second circuit at a position between the pair of positions in the first direction.

4. The optical module according to claim 1, wherein
   the first circuit has the extension region, and
   the one of the pair of first wires is bonded to the extension region of the first circuit.

5. The optical module according to claim 4, wherein the extension region of the first circuit is farther from the semiconductor optical device than a position where the second wire is bonded to the second circuit.

6. The optical module according to claim 5, wherein the extension region of the first circuit is farther from the first capacitor than the position where the second wire is bonded to the second circuit.

7. The optical module according to claim 5, wherein the extension region of the first circuit overlaps with the second capacitor.

8. The optical module according to claim 5, wherein
   each of the first circuit and the second circuit has the extension region, and
   the one of the pair of first wires is bonded to the extension region at a position farther from the first capacitor than the position where the second wire is bonded to the extension region.

9. The optical module according to claim 8, wherein the extension region of the first circuit and the extension region of the second circuit are adjacent to each other in the second direction.

10. The optical module according to claim 9, wherein the extension region of the second circuit is closer to the semiconductor optical device than the extension region of the first circuit.

11. The optical module according to claim 1, wherein
    at least one of the first circuit and the second circuit includes an interconnect line and a pad and a resistor connected in series between the interconnect line and the pad, and
    at least part of the pad is the extension region.

* * * * *